US008762941B2

(12) United States Patent
Loberg

(10) Patent No.: US 8,762,941 B2
(45) Date of Patent: Jun. 24, 2014

(54) RENDERING AND MODIFYING CAD DESIGN ENTITIES IN OBJECT-ORIENTED APPLICATIONS

(75) Inventor: Barrie A. Loberg, Millarville (CA)

(73) Assignee: DIRTT Environmental Solutions, Ltd., Calgary (CA)

( * ) Notice: Subject to any disclaimer, the term of this patent is extended or adjusted under 35 U.S.C. 154(b) by 919 days.

(21) Appl. No.: 12/444,893

(22) PCT Filed: Feb. 13, 2009

(86) PCT No.: PCT/CA2009/000183
§ 371 (c)(1),
(2), (4) Date: Jun. 24, 2009

(87) PCT Pub. No.: WO2009/100538
PCT Pub. Date: Aug. 20, 2009

(65) Prior Publication Data
US 2010/0268513 A1    Oct. 21, 2010

Related U.S. Application Data

(63) Continuation-in-part of application No. 11/577,302, filed as application No. PCT/CA2007/000241 on Feb. 16, 2007, now Pat. No. 7,908,296.

(60) Provisional application No. 61/028,399, filed on Feb. 13, 2008, provisional application No. 60/774,096, filed on Feb. 16, 2006.

(51) Int. Cl.
*G06F 9/44* (2006.01)

(52) U.S. Cl.
USPC .................. 717/116; 703/1; 707/793

(58) Field of Classification Search
USPC ............................................. 717/116
See application file for complete search history.

(56) References Cited

U.S. PATENT DOCUMENTS 5,111,392 A    5/1992  Malin
5,255,207 A   10/1993  Cornwell
(Continued)

FOREIGN PATENT DOCUMENTS

EP    1098244      9/2001
EP    1098244 A2   9/2001
(Continued)

OTHER PUBLICATIONS

Josie Wernecke; Title: The Inventor Mentor: Programming Object Oriented 3D Graphics with Open Inventor; Release 2; Date: Jun. 19, 1997; Published on Web Site: www.cs.ualberta.cal-.

(Continued)

*Primary Examiner* — Li B Zhen
*Assistant Examiner* — Duy Khuong Nguyen
(74) *Attorney, Agent, or Firm* — Workman Nydegger

(57) ABSTRACT

An object-oriented design program provides is configured to instantly render in a three-dimensional interface user CAD designs received as CAD-based design elements (e.g., CAD blocks or lines). The object-oriented program renders the user CAD designs regardless of whether the user designs are practical, or use finishes or colors that are in-stock for the selected design elements. In addition, the object-oriented program can also create intelligent software objects for the CAD-based elements at a later time, upon request by the user. The intelligent software objects can be configured to automatically resolve themselves in view of one or more system limitations and rules in related components, and to replicate any such resolution back to the CAD-based blocks if desired. Thus, a user can have the benefits of instant 3D rendering of CAD drawings with or without the automatic resolution provided by intelligent software objects, depending on the situation.

20 Claims, 7 Drawing Sheets

(56) References Cited

U.S. PATENT DOCUMENTS

| | | |
|---|---|---|
| 5,293,479 A | 3/1994 | Quintero et al. |
| 5,514,232 A | 5/1996 | Burns |
| 5,555,357 A | 9/1996 | Fernandes et al. |
| 5,572,639 A | 11/1996 | Gantt |
| 5,576,965 A | 11/1996 | Akasaka et al. |
| 5,588,098 A | 12/1996 | Chen et al. |
| 5,625,827 A | 4/1997 | Krause |
| 5,684,713 A | 11/1997 | Asada et al. |
| 5,740,341 A | 4/1998 | Oota |
| 5,764,518 A | 6/1998 | Collins |
| 5,870,771 A | 2/1999 | Oberg |
| 5,894,310 A | 4/1999 | Arsenault et al. |
| 5,977,982 A | 11/1999 | Lauzon |
| 5,995,107 A | 11/1999 | Berteig |
| 6,014,503 A | 1/2000 | Nagata |
| 6,020,885 A | 2/2000 | Honda |
| 6,037,945 A | 3/2000 | Loveland |
| 6,253,167 B1 | 6/2001 | Matsuda |
| 6,292,810 B1 | 9/2001 | Richards |
| 6,401,237 B1 | 6/2002 | Ishikawa |
| 6,459,435 B1 | 10/2002 | Eichel |
| 6,466,239 B2 | 10/2002 | Ishikawa |
| 6,493,679 B1 | 12/2002 | Rappaport |
| 6,509,906 B1 * | 1/2003 | Awe et al. .................... 345/619 |
| 6,662,144 B1 | 12/2003 | Normann et al. |
| 6,690,981 B1 | 2/2004 | Kawachi |
| 6,701,288 B1 | 3/2004 | Normann |
| 6,721,684 B1 | 4/2004 | Saebi |
| 6,772,168 B2 | 8/2004 | Ardoin et al. |
| 6,888,542 B1 | 5/2005 | Clauss |
| 6,922,701 B1 | 7/2005 | Ananian et al. |
| 6,971,063 B1 | 11/2005 | Rappaport |
| 6,985,832 B2 | 1/2006 | Saebi |
| 6,999,102 B2 | 2/2006 | Felser et al. |
| 7,019,753 B2 | 3/2006 | Rappaport |
| 7,042,440 B2 | 5/2006 | Pryor et al. |
| 7,062,454 B1 | 6/2006 | Giannini |
| 7,062,722 B1 | 6/2006 | Loberg |
| 7,080,096 B1 | 7/2006 | Imamura |
| 7,085,697 B1 | 8/2006 | Rappaport |
| 7,096,173 B1 | 8/2006 | Rappaport |
| 7,155,228 B2 | 12/2006 | Rappaport |
| 7,171,208 B2 | 1/2007 | Rappaport |
| 7,200,639 B1 | 4/2007 | Yoshida |
| 7,216,092 B1 | 5/2007 | Weber |
| 7,243,054 B2 | 7/2007 | Rappaport |
| 7,246,044 B2 | 7/2007 | Imamura |
| 7,246,045 B1 | 7/2007 | Rappaport |
| 7,249,005 B2 | 7/2007 | Loberg |
| 7,266,768 B2 | 9/2007 | Ferlitsch |
| 7,277,572 B2 | 10/2007 | MacInnes |
| 7,277,830 B2 | 10/2007 | Loberg |
| 7,299,168 B2 | 11/2007 | Rappaport |
| 7,299,416 B2 | 11/2007 | Jaeger |
| 7,340,383 B2 | 3/2008 | Mayuzumi |
| 7,353,192 B1 | 4/2008 | Ellis |
| 7,587,302 B2 | 9/2009 | Arvin |
| 7,643,966 B2 | 1/2010 | Adachi |
| 7,661,959 B2 | 2/2010 | Green |
| 7,676,348 B2 | 3/2010 | Okada |
| 7,788,068 B2 | 8/2010 | Mangon |
| 7,814,436 B2 | 10/2010 | Schrag |
| 7,822,584 B1 | 10/2010 | Saebi |
| 7,823,074 B2 | 10/2010 | Takemura |
| 7,856,342 B1 | 12/2010 | Kfouri |
| 7,877,237 B1 | 1/2011 | Saebi |
| 7,996,756 B2 | 8/2011 | Eilers |
| 8,108,267 B2 | 1/2012 | Varon |
| 8,132,123 B2 | 3/2012 | Schrag |
| 8,134,553 B2 | 3/2012 | Saini |
| 8,185,219 B2 | 5/2012 | Gilbert |
| 8,244,025 B2 | 8/2012 | Davis |
| 8,314,799 B2 | 11/2012 | Pelletier |
| 8,352,218 B2 | 1/2013 | Balla |
| 8,462,147 B2 | 6/2013 | Sugden |
| 8,499,250 B2 | 7/2013 | Wetzer |
| 8,508,539 B2 | 8/2013 | Vlietinck |
| 8,510,672 B2 | 8/2013 | Loberg |
| 2001/0024211 A1 | 9/2001 | Kudukoli |
| 2001/0047250 A1 | 11/2001 | Schuller |
| 2001/0047251 A1 | 11/2001 | Kemp |
| 2002/0010589 A1 | 1/2002 | Nashida |
| 2002/0069221 A1 | 6/2002 | Rao |
| 2002/0083076 A1 * | 6/2002 | Wucherer et al. ............. 707/102 |
| 2002/0085041 A1 | 7/2002 | Ishikawa |
| 2002/0091739 A1 | 7/2002 | Ferlitsch |
| 2002/0093538 A1 | 7/2002 | Carlin |
| 2002/0144204 A1 | 10/2002 | Milner |
| 2002/0188678 A1 | 12/2002 | Edecker |
| 2002/0196285 A1 | 12/2002 | Sojoodi |
| 2004/0012542 A1 | 1/2004 | Bowsher |
| 2004/0027371 A1 | 2/2004 | Jaeger |
| 2004/0098691 A1 | 5/2004 | Teig |
| 2004/0117746 A1 | 6/2004 | Narain et al. |
| 2004/0145614 A1 | 7/2004 | Takagaki |
| 2004/0153824 A1 | 8/2004 | Devarajan |
| 2004/0204903 A1 | 10/2004 | Saebi |
| 2004/0205519 A1 | 10/2004 | Chapel |
| 2005/0041028 A1 | 2/2005 | Coutts |
| 2005/0065951 A1 | 3/2005 | Liston |
| 2005/0071135 A1 * | 3/2005 | Vredenburgh et al. ............ 703/1 |
| 2005/0081161 A1 * | 4/2005 | MacInnes et al. ............ 715/765 |
| 2006/0028695 A1 * | 2/2006 | Knighton et al. ............. 358/474 |
| 2006/0041842 A1 | 2/2006 | Loberg |
| 2006/0174209 A1 | 8/2006 | Barros |
| 2006/0206623 A1 | 9/2006 | Gipps et al. |
| 2006/0271378 A1 | 11/2006 | Day |
| 2007/0088704 A1 | 4/2007 | Bourne |
| 2007/0115275 A1 | 5/2007 | Cook et al. |
| 2007/0168325 A1 | 7/2007 | Bourne |
| 2007/0180425 A1 * | 8/2007 | Storms et al. ................. 717/104 |
| 2007/0188488 A1 | 8/2007 | Choi |
| 2007/0204241 A1 | 8/2007 | Glennie et al. |
| 2007/0219645 A1 | 9/2007 | Thomas et al. |
| 2007/0240049 A1 | 10/2007 | Rogerson et al. |
| 2007/0250295 A1 | 10/2007 | Murray |
| 2007/0260432 A1 | 11/2007 | Okada |
| 2007/0271870 A1 | 11/2007 | Mifsud et al. |
| 2007/0294622 A1 | 12/2007 | Sterner |
| 2008/0036769 A1 | 2/2008 | Coutts |
| 2008/0052618 A1 | 2/2008 | McMillan |
| 2008/0143884 A1 | 6/2008 | Foster |
| 2008/0275674 A1 | 11/2008 | Reghetti et al. |
| 2008/0282166 A1 | 11/2008 | Fillman |
| 2008/0303844 A1 | 12/2008 | Reghetti et al. |
| 2008/0309678 A1 | 12/2008 | Reghetti et al. |
| 2009/0113349 A1 | 4/2009 | Zohar |
| 2009/0119039 A1 | 5/2009 | Banister et al. |
| 2009/0138826 A1 | 5/2009 | Barros |
| 2009/0148050 A1 | 6/2009 | Reghetti et al. |
| 2009/0210487 A1 | 8/2009 | Westerhoff et al. |
| 2009/0248184 A1 | 10/2009 | Steingart |
| 2009/0273598 A1 | 11/2009 | Reghetti et al. |
| 2010/0017733 A1 | 1/2010 | Barros |
| 2010/0121614 A1 | 5/2010 | Reghetti et al. |
| 2010/0122196 A1 | 5/2010 | Wetzer |
| 2010/0138762 A1 | 6/2010 | Reghetti et al. |
| 2010/0185514 A1 | 7/2010 | Glazer |
| 2011/0078169 A1 | 3/2011 | Sit |
| 2011/0169826 A1 | 7/2011 | Elsberg |
| 2011/0258573 A1 | 10/2011 | Wetzer |
| 2011/0320966 A1 | 12/2011 | Edecker |
| 2012/0005353 A1 | 1/2012 | Edecker |
| 2012/0331422 A1 | 12/2012 | High |

FOREIGN PATENT DOCUMENTS

| | | |
|---|---|---|
| JP | EP1204046 A1 | 5/2002 |
| WO | WO9003618 A1 | 4/1990 |
| WO | WO9322741 A2 | 11/1993 |
| WO | WO02075597 | 9/2002 |
| WO | WO2005033985 | 4/2005 |
| WO | WO2006018744 A2 | 2/2006 |
| WO | WO2007093060 A1 | 8/2007 |

(56) References Cited

FOREIGN PATENT DOCUMENTS

| WO | 2007106873 | 9/2007 |
|---|---|---|
| WO | 2006018740 | 2/2009 |
| WO | 2009100538 | 8/2009 |

OTHER PUBLICATIONS

Office Action Mailed Jul. 29, 2009, U.S. Appl. No. 11/204,421.
International Search Report and Opinion on PCT/CA2007/000241, mailed May 15, 2007.
International Search Report and Opinion on PCT/CA2009/000190, mailed Jun. 5, 2009.
International Search Report and Opinion on PCT/CA2009/000183, mailed Jun. 9, 2009.
International Search Report and Opinion on PCT/CA2009/000311, mailed Jul. 30, 2009.
Office Action Mailed Aug. 18, 2010, U.S. Appl. No. 11/577,302.
International Search Report & Written Opinion for PCT/US2010/058092 dated Jul. 27, 2011.
USPTO, Office Action in U.S. Appl. No. 12/444,886, mailed Oct. 27, 2011, 24 pages.
USPTO, Office Action in U.S. Appl. No. 12/444,890, mailed Oct. 27, 2011, 30 pages.
Chan, et al.: "Design of a Walkthrough System for Indoor Environments from Floor Plans"; Proceedings of the 1998 IEEE Conference on Information Visualization, Jul. 29-31, 1998, pp. 50-57.
Office Action Mailed Oct. 18, 2006, U.S. Appl. No. 11/204,419.
Office Action Mailed Oct. 19, 2006, U.S. Appl. No. 11/204,420.
Office Action Mailed Nov. 28, 2007, U.S. Appl. No. 11/204,421.
Office Action Mailed Aug. 11, 2008, U.S. Appl. No. 11/204,421.
Office Action Mailed Dec. 23, 2008, U.S. Appl. No. 11/204,421.
Advisory Action Mailed Mar. 31, 2009, U.S. Appl. No. 11/204,421.
Advisory Action Mailed May 15, 2009, U.S. Appl. No. 11/204,421.
Marir F et al: "OSCONCAD: a model-based CAD system integrated with computer applications", Proceedings of the International Construction IT Conference, vol. 3, 1998.
EPO Search Report for EP07701791 dated Aug. 21, 2012.
USPTO, Office Action in U.S. Appl. No. 12/444,886, mailed Aug. 16, 2012.
International Search Report for PCT/CA2009000190 mailed Apr. 12, 2012.
Blythe, Rise of the Graphics Processor, IEEE, 2008.
U.S. Office of Personnel Management, Clear Cache, IE, 2007.
Wang, Intellectual Property Protection in Collaborative Design through Lean information Modeling and Sharing , 2006.
Lea, Community Place Architecture and Performance, 2007.
Autodesk, Maya 8.5 Shading, 2007.
CRC, Final Report Collaboration Platform. 2009.
Mental Images GmbH, RealityServer Functional Overview White Paper, 2007.
Rozansk, Software Systems Architecture Working With Stakeholders Using Viewpoints and Perspectives, 2008.
Sony, Community Place Conductor 2.0 Users Manual, 1998.
Vasko, Collaborative Modeling of Web Applications for Various Stakeholders, 2009.
Gross M D: "Why can't CAD be more like Lego? CKB, a program for building constructions kits", Automation in Construction, Elsevier Science Publishers, Amsterdam, NL, vol. 5, No. 4, Oct. 1, 1996 pp. 285-300, XP004072247, ISSN: 0926-5805, DOI:10.1016/S0926-5805(96)00154-9.
European Search Report—Application No./ Patent No. 09719352.8-1960 / 2252951 PCT/CA2009000311.

* cited by examiner

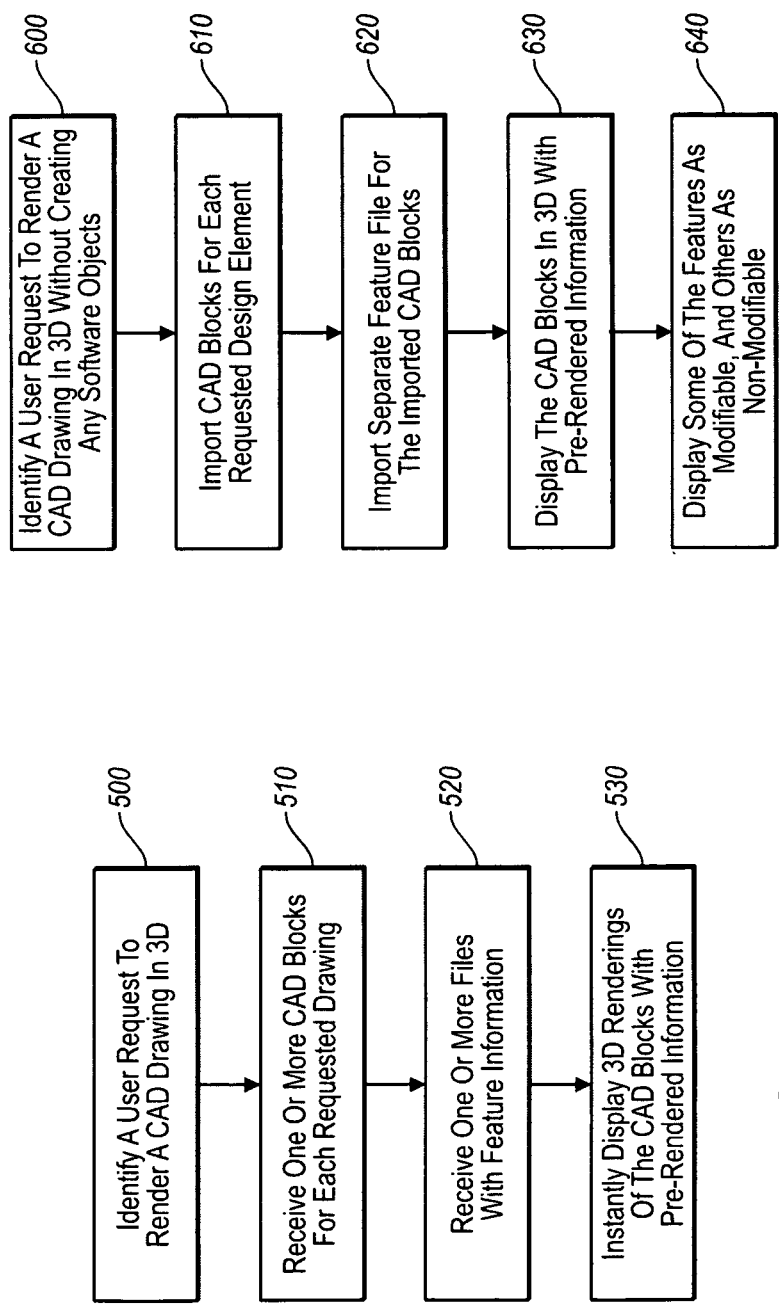

RENDERING AND MODIFYING CAD DESIGN ENTITIES IN OBJECT-ORIENTED APPLICATIONS

CROSS-REFERENCE TO RELATED APPLICATIONS

This application is a U.S. National Stage Application corresponding to PCT/CA2009/000183, filed on Feb. 13, 2009, entitled "Rendering and Modifying CAD Design Entities in Object-Oriented Applications," which claims the benefit of priority to U.S. Provisional Application No. 61/028,399, filed on Feb. 13, 2008, entitled "Automated Conversion of CAD-Based Blocks to Intelligent Rendered Objects in Object-Oriented Design Software."

This application is also a continuation-in-part of U.S. patent application Ser. No. 11/577,302, filed on Aug. 16, 2008, entitled "Integration of Object-Oriented Design Software with Record-Based CAD Software," which is a 371 US National Stage Application corresponding to PCT Application No. CA07/000241, filed on Feb. 16, 2007, which claims priority to U.S. Provisional Patent Application No. 60/774,096, filed on Feb. 16, 2006. The entire content of each of the aforementioned applications is incorporated herein by reference.

BACKGROUND OF THE INVENTION

1. Technical Field

The present disclosure relates generally to software used for modeling and design of interior or exterior spaces.

2. Background and Relevant Art

As computerized systems have increased in popularity, so has the range of applications that incorporate computational technology. Computational technology now extends across a broad range of applications, including a wide range of productivity and entertainment software. Indeed, end users can now find computational technology and related software in a wide range of generic applications that are suited for many environments, as well as fairly industry-specific software.

Some examples of industry-specific application programs include those known as Computer-aided design (i.e., "CAD") programs, such as AUTOCAD. In general, CAD programs provide a user with the ability to draw lines or blocks (which represent groupings of lines that represent objects) on a CAD user interface, where those lines represent various "design entities" or "design elements" in a plan view of a raw design space. To manage each of the various design entities created through the user interface, CAD programs typically incorporate a record-based database.

In general, the record-based database can also be referred to as a "linear" database, since it includes a set of sequential records whose relationships are based primarily on the sequence/moment in time at which those records were created. For example, when a user creates a line (i.e., a "design entity") in a CAD user interface, the data related to that line (such as type, position, etc.) are stored in a newly-created "record" in the record-based (linear) database. When a user creates the next line (or circle, etc.) in the CAD user interface, the corresponding linear (or sequential) database creates a new record in the linear database. Since the main relationship between these records is primarily based on sequence, each record includes little or no relation to other records within the database that were created much earlier or later in the sequence.

In addition, CAD programs generally limit the user's ability to layout or specify furniture with only rudimentary geometry-based applications. In conventional geometry-based application programs, the user can place geometric "blocks" representing the product in space, and the application program constrains placement of the block relative to other blocks (representative of other furniture) based solely on the relation of geometric features of each block in a "plan view." For example, in a conventional design program, a user can use a "plan view" interface of the program to place a work surface block immediately next to a wall panel block. The user can then use corner points, end points, mid-points or similar for proper alignment (i.e., to connect the corner point of the work surface block with the end point of the wall panel block).

Conventional software can also implement sub-routines within the software to automate the location of these blocks in relation to each other's geometric features. Unfortunately, however, there is typically no true product intelligence within conventional geometry-based design software. In most cases, for example, the user will still need to provide information regarding which products may be used together, how those products behave together, and which connection components are required to attach the products together. The often means that the user/designer needs to personally remember every part and piece related to the products placed in the context of the layout. If the user desires to change the elements associated with a block, such change may be laborious, and often requires the user starting the design over from the start.

Furthermore, the representative views that the geometry-based design program provides to the user of the products are typically rudimentary and subject to interpretation. While some application programs may provide three-dimensional views, if they exist at all, such programs typically do not provide such views with the appropriate colors, finishes, materials, shadowing, shading, transparency or reflectivity. Rather, to get such views, a user will often need to initialize or export one view from the geometry-based application to yet another separate rendering software application. Even then, such separate rendering software provides only one view at a time, whereby the user selects a specific viewing angle and then captures that view in a single static image, with applied finishes, materials, shadowing, shading and reflectivity. Thus, the user may still need to manually replicate any change or request in one view to another view in another application, which results in repeat rendering of those additional views. Furthermore, more complicated renderings that could allow a "fly through" navigation-type experience can take conventional rendering applications minutes, hours, or even days to render.

By contrast, there are also now design applications that incorporate non-sequential, three-dimensional ("3D") relationships for records, such as object-oriented software programs used for design functions. Generally, an object-oriented database represents each entity as an intelligent object block (analogous to a linear database's record). In contrast with the record in a record-based database, which is basically just a collection of data, each object block can be thought of as an independent program of computer-executable instructions in addition to certain user-entered data. The independent, intelligent nature of object entities can enable a wide range of functionality not otherwise available to records or linear databases.

Unfortunately, traditional conventional object-oriented design programs still have other limitations when importing data from linear records since the user will still need to supply finishes, materials, shadowing, shading, and reflectivity with respect to the imported CAD blocks. One such limitation can be due to the otherwise advantages of the object-oriented application itself. For example, if a CAD-based design comprised design choices that were not currently available in inventory (e.g., drawing a blue colored glass table when only black or brown wood grain tables are available), the object-oriented software might not render the user's design as drawn in the CAD program without warning. Alternatively, and also potentially without warning, the object-oriented software might correct the design element to appear in some way not intended by the user.

Accordingly, conventional records-based and object-oriented-based design or rendering programs present a number of issues that can be addressed.

BRIEF SUMMARY OF THE INVENTION

Implementations of the present invention overcome one or more problems in the art with systems, methods, and computer program products configured to instantly render user-drawn CAD design elements such as blocks and/or lines (in a CAD application program) as one or more design elements in a separate, three-dimensional interface. This rendering is a three dimensional rendering, enabling the user to move, rotate, "fly-through" or edit the one or more design elements in the three-dimensional interface. This can allow the user to effectively view a CAD-based design in full context, even if there may be certain errors or inconsistencies in the design. In addition, in at least one implementation, the user can also convert the design elements to intelligent objects, and allow the system to warn or automatically correct for any errors or deficiencies in the design. This can allow the user to correlate the user's design changes in the CAD interface with real-world considerations, ensuring accuracy of the user's viewing experience, as well as of ordering and manufacturing requests.

For example, at least one implementation of a computer-implemented method of using an object-oriented design program to instantly render user designs made in a CAD program can involve identifying one or more user requests to render in a three-dimensional user interface one or more design elements created in a separate CAD user interface. The method can also involve receiving one or more CAD design elements that represent one or more CAD blocks and/or lines created by the user in the CAD user interface. In addition, the method can involve receiving one or more files that identify features of the design elements that the user selected in the CAD user interface. Furthermore, the method can involve automatically displaying the CAD blocks as three-dimensional design elements in the three-dimensional user interface using previously-generated rendering instructions.

In addition to the foregoing, an additional or alternative method of using an object-oriented design program to instantly render user designs made in the CAD program can involve identifying one or more user requests to render in a three-dimensional user interface one or more design elements created in a separate CAD user interface. In this case, the one or more user requests further indicate that no intelligent objects are to be created. The method can also involve importing from the CAD program into the object-oriented program one or more CAD blocks and/or lines that represent one or more design elements created by the user in the CAD user interface.

In addition, the method can involve importing a separate feature file comprising user-selected features corresponding to the one or more design elements in the one or CAD blocks and/or lines. Furthermore, the method can involve automatically displaying the CAD blocks as three-dimensional design elements in the three-dimensional user interface using previously-generated rendering instructions. Still further, the method can involve displaying in the three-dimensional user interface at least one of the user-selected features from the feature file as being non-modifiable, and another of the user-selected features from the feature file as being modifiable.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims, or may be learned by the practice of such exemplary implementations as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 5 illustrates a flowchart of a series of acts in a method of instantly rendering one or more records-based CAD drawings in 3D using the intermediate interface, which is object oriented; and FIG. 6 illustrates another flowchart of a series of acts in an additional or alternative method of instantly rendering one or more CAD drawings in 3D using an object-oriented design program.

DETAILED DESCRIPTION OF THE PREFERRED EMBODIMENTS

Figure 1B:
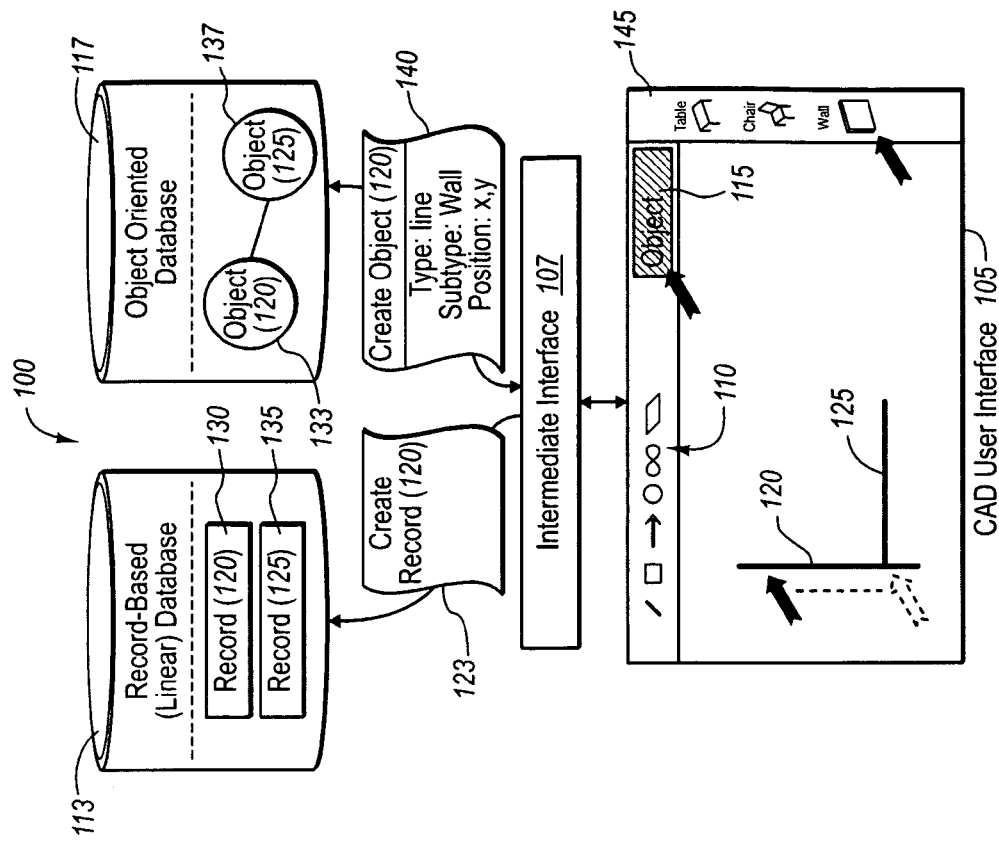
FIG. 1B illustrates the schematic of FIG. 1A in which a user creates or modifies one or more design entities through the CAD user interface after selecting one or more object status items.

The present invention extends to systems, methods, and computer program products configured to instantly render user-drawn CAD design elements such as blocks and/or lines (in a CAD application program) as one or more design elements in a separate, three-dimensional interface. This rendering is a three dimensional rendering, enabling the user to move, rotate, "fly-through" or edit the one or more design elements in the three-dimensional interface. This can allow the user to effectively view a CAD-based design in full context, even if there may be certain errors or inconsistencies in the design. In addition, in at least one implementation, the user can also convert the design elements to intelligent objects, and allow the system to warn or automatically correct for any errors or deficiencies in the design. This can allow the user to correlate the user's design changes in the CAD interface with real-world considerations, ensuring accuracy of the user's viewing experience, as well as of ordering and manufacturing requests.

As will be understood more fully herein, these and other advantages are realized at least in part since implementations of the present invention provide one or more mechanisms for automatically and instantly rendering record-based data (e.g., linear or sequential database entries representing graphical entities in a CAD application), as well as correlating such data to detailed, object-oriented entities (or "intelligent software objects"). This translation/rendering/linking/correlating can be accomplished and mediated at least in part through the use of one or more intermediate interface 107 components configured to correlate record-based changes with object entities in an object-oriented database. Linking to the object entities, in turn, allows a CAD interface to take advantage of some of the more complex features of an object-oriented system, such as producing, viewing and modifying three-dimensional (3D) views of a design. In one implementation, the object-oriented design application program is implemented using a JAVA-based programming language.

The use of object entities (e.g., JAVA-based object entities) through a separate or intermediate interface 107 allows a user to work within a record-based CAD application, within an object-oriented application, or within a third application (or corresponding output files) linked to the CAD application. In one implementation, such as understood more fully with respect to FIGS. 2-6, the intermediate interface 107 can be understood as linking to the CAD application and to textual file, which are representing outputs from a third party application, or inputs back into the third party application from CAD or textually. The user can then implement the functions and output from any or all of the CAD-based or objected-oriented-based applications in an integrated, seamless fashion, such as modifying (e.g., trimming, extending, or mirroring, etc.) design entities without additional reactors, lisp type programs, or additional input and without having to replace the pre-existing CAD-based application program.

Figure 1A:
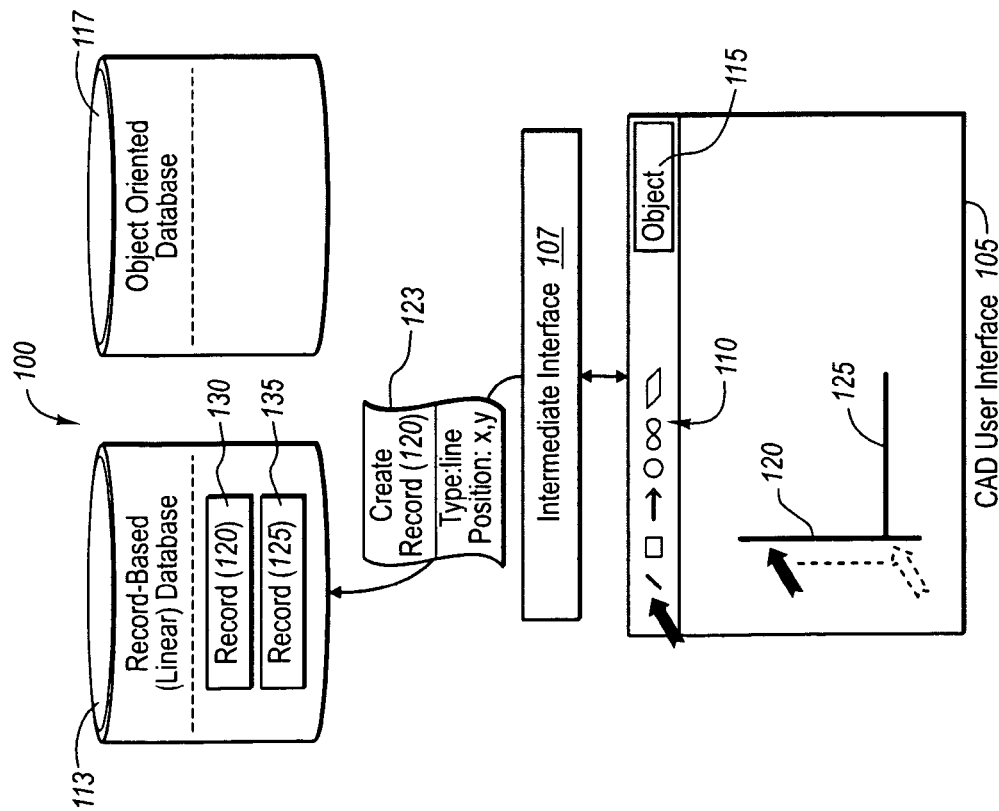
FIG. 1A illustrates a schematic diagram in which a user creates or modifies one or more design elements through a CAD user interface that is linked to both a record-based database and an object-oriented database using a default in accordance with an implementation of the present invention with object states set to off.

FIG. 1A illustrates an overview schematic diagram in which a CAD user interface is linked to both a record-based database and an object-oriented database via one or more intermediate interface 107 components using one possible default setting. In particular, FIG. 1A illustrates a basic CAD user interface 105 comprising a series of drawing tools 110. FIG. 1A also illustrates, however, in contrast with typical CAD-based application programs, one or more object "function" buttons 115 provided by an object-oriented design application program. Furthermore, FIG. 1A illustrates the use of one or more intermediate interface 107 components 107, which are part of the object-oriented design application program, that interface between the CAD user interface 105 and both a record-based database 113 and an object-oriented database 117.

As a preliminary matter, reference herein to "CAD" or "AUTOCAD" is meant to describe programs that incorporate general design functionality using linear or record-based databases, rather than a specific reference to any particular existing product. In addition, although any database entry might be thought of as a "record" on some level, the term "record-based" when referring herein to an application program or database will refer to application programs or databases that primarily use sequential or "linear" database entry/modification mechanisms, rather than object-oriented database entries. As previously mentioned, these types of database entries (i.e., records) are not only typically sequential, but also tend to include only basic information about a design entity, such as design entity type, design entity position, or the like. In contrast to object-oriented applications that use object entities, therefore, a "record" can be understood herein as a passive data entry, while an "object block" can be understood herein as an active data entry with added intelligence.

In any event, FIG. 1A illustrates an implementation of the present invention in which a user creates one or more design entities without selecting one or more object status items 115. In this case, the object state for each design entity would be set to "off." In general, object status item 115 can comprise any of a selectable button, icon, or other form of selectable option that would be presented through a graphical user interface on a computer display. In one implementation, the object-oriented design application provides one or more plugins or modules, in addition to the object status item 115, which tag each design entity created or used in CAD user interface 115 with an object status field (not shown). The object status field for each design entity, therefore, presents the "object state," which indicates whether the user has selected the object status item 115 for that design entity.

In this example, FIG. 1A shows that a user selects use of a line, and draws line (or block) 120, potentially representing a wall in a design space. Since the user has not, in this example, selected item 115, intermediate interface 107 determines that the object state for design entities 120 and 125 are set to "off," (or other appropriate identifier in the object status field), and thus no desire from the user to link these design entities to an object entity. As shown in FIG. 1A, therefore, intermediate interface 107 identifies the object state from any object status field associated with instructions regarding design entity 120 as set to "off." Intermediate interface 107 then simply passes instructions regarding the creation of design entity 120 as message 123 to record-based database 113, but sends no corresponding instructions to object-oriented database 117.

In contrast with FIG. 1A, however, FIG. 1B shows that the user has selected object status item 115 in the context of creating or modifying design entity 120. In one implementation, mere selection of object status item 115 can involve intermediate interface 107 copying or importing all record data (e.g., 130, 135) corresponding to each design entity displayed in CAD user interface 105 (or all applicable records) and creating corresponding object entities (e.g., 133, 137) in database 117. In the illustrated example, however, this selection simply causes a change in object state at least with respect to design entity 120 to "on," so that design entity 120 is correlated with an object entity. For example, FIG. 1B shows that the user's drawing or placement of design entity 120 causes intermediate interface 107 to send a "create object" message 140 to object-oriented database 117, in addition to passing message 123 (also shown in FIG. 1A) indicating a request to create a new record 130.

In general, one will appreciate that there are a number of different ways that a user can correlate design entity 120 between record-based database 113 and object-oriented database 117. For example, a user could select object status item 115 before drawing any design entities, and set that as a default for all design entities until deselecting the object status item 115. Since each following design entity would have the same object state of "on," the intermediate interface 107 would create or modify both a record and an object entity corresponding to the design entity during creation, modification, or other form of update.

In other cases, however, the user could select particular design entities to have a particular object state of "on" or "off." In particular, the user could select object status item 115 during or after creating design entity 120, and/or make an additional selection (not shown) indicating that design entity 120 should have an object state of "on." In such a case, intermediate interface 107 could recognize that creation or modification of design entity involves modifications to an object entity in database 117 as well as a record in database 113, while creation or modification of design entity 125 involves modifications only to a record in database 113. In still further cases, one or more selection items (not shown) can be provided for the user to select conversion of all design entity records (or all records, design entity or not) from database 113 to database 117. This would involve any one or more of copying, transferring, or moving data from database 113 to database 117 to ensure proper correlation, or total substitution of record-based database 113 with object-oriented database 117.

In addition to the foregoing, FIG. 1B also shows that selection of object status item 115 can result in the presentation of additional user interfaces or design choices to a user. For example, FIG. 1B shows that upon identifying that the user has selected object status item 115, intermediate interface 107 presents design interface options 145 as an inclusion in CAD user interface 105, or as a separate standalone interface. In either case, the user can add refinements or other details to a design entity in CAD user interface 105. For example, FIG. 1B shows that the user has selected a "wall" option, in addition to the object status item 115. Thus, when the user creates design entity 120, the intermediate interface 107 recognizes the object state for the design entity, as well as the corresponding details entered through interface 145.

The intermediate interface 107 then sends message 140 to object-oriented database 117 not only to create an object (133) for design entity 120, but also to include the additional details requested, such as that the design entity represents a wall, or even other details about the wall structure, color, design, texture, materials, etc. Ordinarily, however, these and other details might not be included in the typical record for a design entity in a CAD application. For example, FIG. 1A shows that intermediate interface 107 simply sends the same message 123 as shown in FIG. 1A that the type of design entity is a "line," as well as the position information. In any event, one will appreciate that design entities that are correlated with object entities can be opened and modified in any user interface (whether the CAD user interface 105, or another user interface provided by the object-oriented design application program). By contrast, design entities that are not correlated with object entities (i.e., object status set to "off" will generally be opened or modified only in the CAD application program.

Figure 1C:
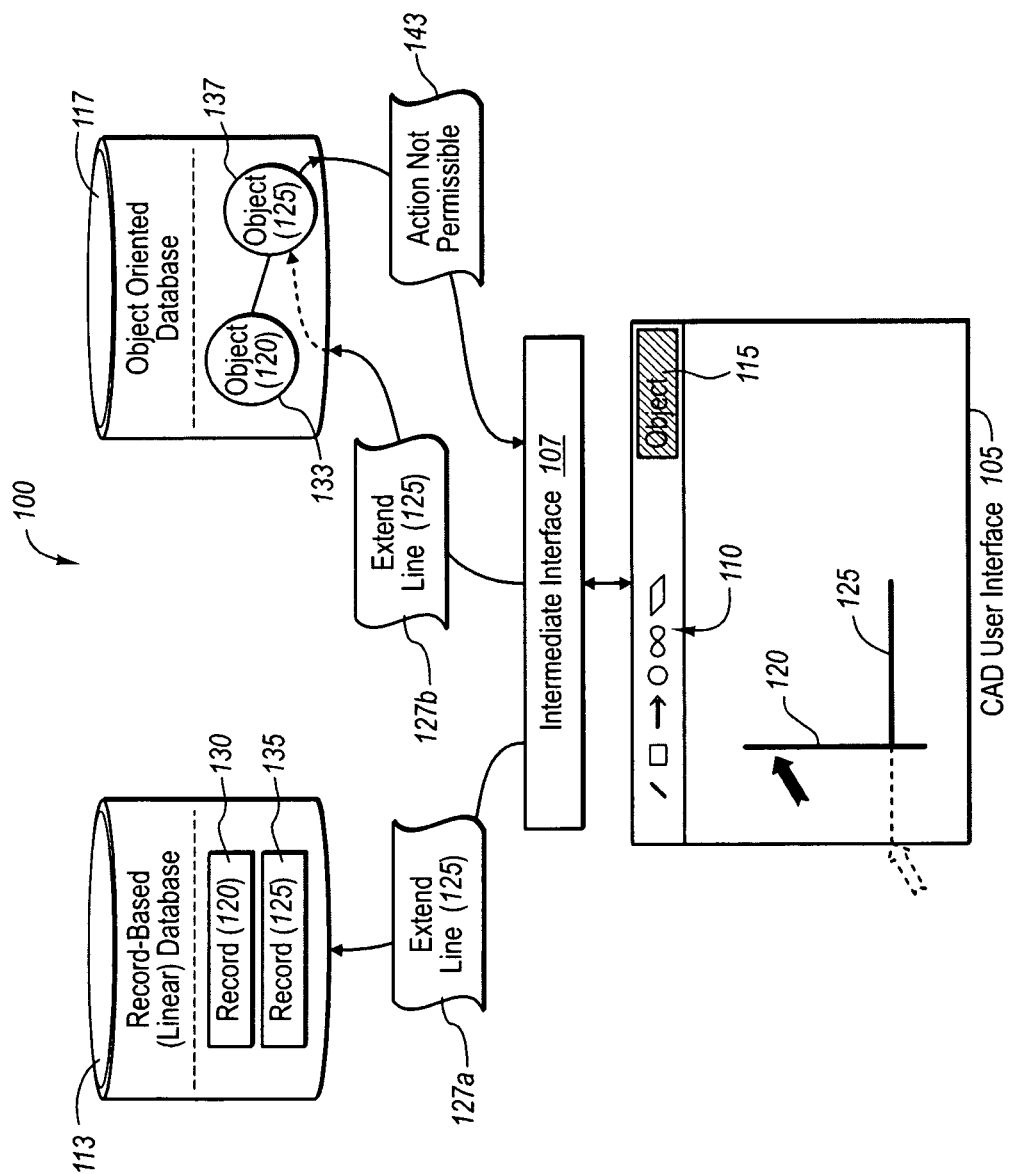
FIG. 1C illustrates an implementation of the present invention in which an object block of the object-oriented database of FIGS. 1A-1B corrects a user selection for an impractical modification of a design entity in the CAD user interface of FIGS. 1A-1B.

FIG. 1C illustrates an implementation of the present invention in which an object of the object-oriented database of FIGS. 1A-1B attempts to resolve a potentially impractical user selection. In particular, FIG. 1C illustrates at least one of the advantages provided to the record-based CAD application by implementing the functionality of an object-oriented design application/database. For example, FIG. 1C shows that the user extends the design entity 125, in this case a wall, through design entity 120, which in this case is also an outer wall.

In a typical CAD-based application, the user might be free to draft this extension to design entity 125 because the records 130, 135 of database 113 do not resolve the conflict, and only implement or record the user's drawing selection. By contrast, FIG. 1C shows that the objects 133, 137 of object-oriented database 117 can utilize intelligence to resolve the conflict. For example, FIG. 1C shows that, upon receiving the user's selection, intermediate interface 107 sends message 127a to record-based database 113, of the user's selection for line 125. In addition, intermediate interface 107 sends message 127b to object-oriented database 117, which also includes essentially the same information, as applicable, regarding the user's selection for line 125. In contrast with records 120 and 125, however, FIG. 1C shows that object 137 determines based on its own data (as well as, potentially, on a comparison with the data of object 133) that this request is either impractical or impermissible.

Accordingly, FIG. 1C shows that object 137 sends a response message 143 to intermediate interface 107 indicating that this request is not permissible. Intermediate interface 107 can then perform any number of corresponding response actions. In one implementation, for example, intermediate interface 107 passes one or more messages (not shown) to CAD user interface 105, which causes the new but impermissible user selection (shown in dashes) to be removed or corrected. For any such removal or correction, intermediate interface 107 can also pass one or more additional messages (not shown) to record-based database 113 to update record 135 in the same manner. In other or alternative implementations, intermediate interface 107 can send one or more messages to prompt the user for additional action based on a warning signal, and/or pass a corresponding signal to record 135 in database 113.

One will appreciate that this corrective ability can be applied to a wide number of design entities drawn or made by a user in CAD user interface 105. For example, the object entities of database 117 could correct a situation where the user drew the components of a chair and placed those components inadvertently on top of a wall. In such a case, the object entity might cause the CAD user interface 105 to automatically move the chair to a more appropriate position, if not deleting the user's placement altogether.

Figure 1D:
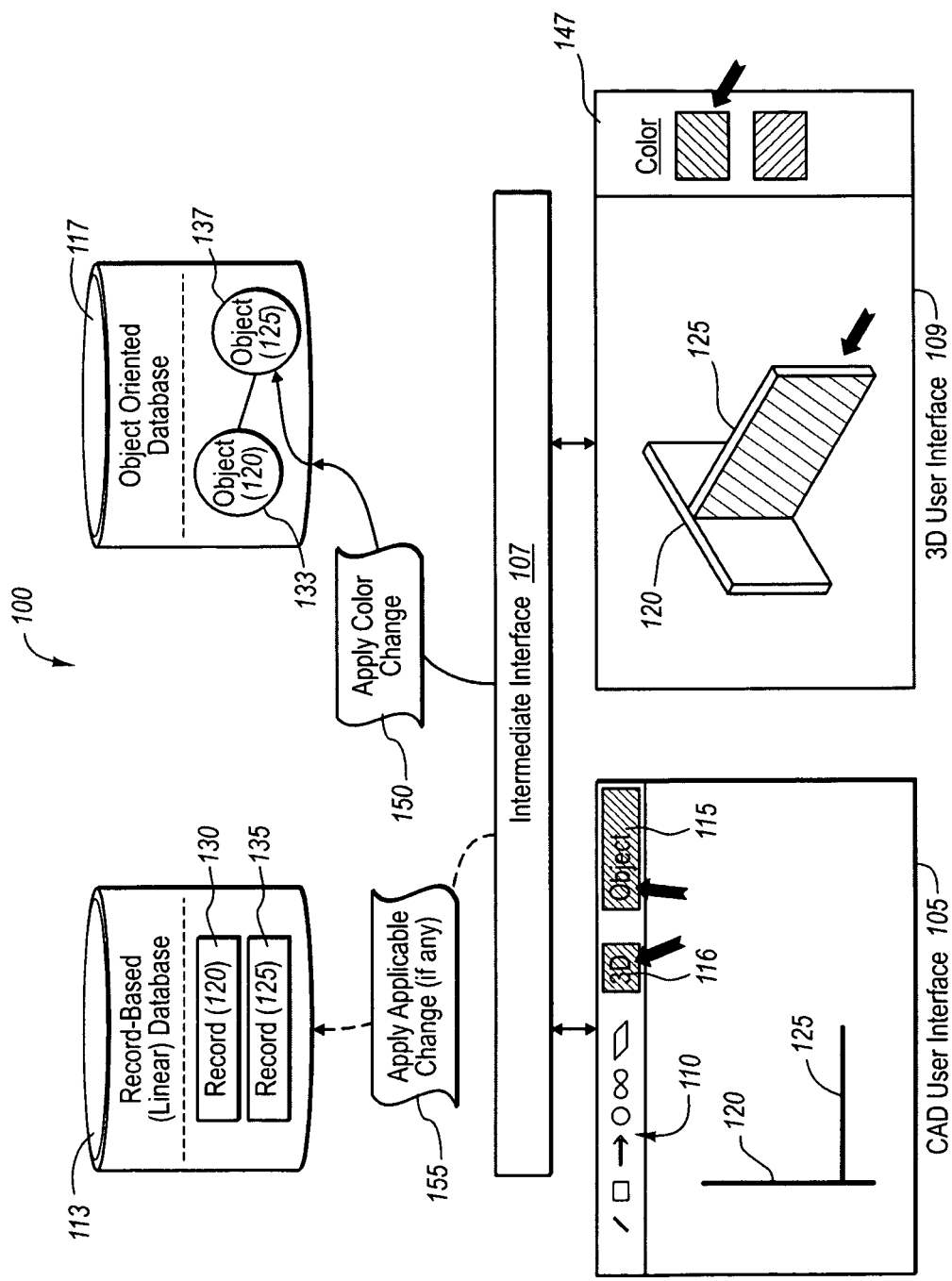
FIG. 1D illustrates an implementation of the present invention in which a user opens a three-dimensional interface and makes corresponding changes to one or more design entities of the CAD user interface in the three-dimensional interface.

In addition to the foregoing, the object entities of database 117 can be used to correct or implement user selections made in views other than the CAD user interface 105. For example, FIG. 1D shows that the user has selected a "3D" option 116.

In general, 3D option 116 can be any of a button, icon, or menu pull-down option, or the like provided by the object-oriented design application (or plugin/component thereof) through the CAD user interface 105. In at least one implementation, 3D option 116, as with object option 115, is one of many selectable options in the CAD user interface 105, and can be used to open a new set of toolbars and/or interfaces. In any case, FIG. 1D shows that, upon such selection and ultimately requesting creation of a 3D representation, intermediate interface 107 opens 3D interface 109 is opened, showing lines 120 and 125 as walls in three-dimensional format.

In general, the three-dimensional format of interface 109 is generated at least partly from the more detailed information contained in the object entities (e.g., 133, 137) of database 117. For example, the object entities of database 117 can contain information not only of size or position, but also of texture, color, width or gauge, number or types of mounting components, as well as three-dimensional representations of the types of materials used in the wall (e.g., glass, wood, dry wall, etc.), the lighting at a particular angle, etc. The object entities can also include information about pricing for various components, or other forms of information deemed applicable for each design entity.

As such, the user can then navigate around or through any of these design entities, in various angles and degrees of proximity, and even select pricing or other details instantly with respect to a particular design entity. The user can also make any selections or changes to the three-dimensional views (or two-dimensional views, as appropriate) of each design entity, and have those reflected seamless in all entries for each corresponding record or object, regardless of database (113 and/or 117).

In this case, for example, FIG. 1D shows that the user's selection of 3-D for item 116 results not only in the opening of 3-D interface 109, as well as the opening of a color palette interface 147. One will appreciate, however, that the color palette may also be opened by separate command, and not necessarily upon creation or opening of 3D interface 109. In any case, FIG. 1D further shows that the user selects one of the colors from color palette interface 147, which the intermediate component 107 then applies to design entity 127. Intermediate component 107 then sends message 150 to database 117, which updates the intelligent object 137 for this color selection (if available). Similarly, and if applicable, intermediate component 107 can then send a message 155 to record-based database 113 to update record 135 for design entity 125. In the event color is not used in the CAD user interface 105, intermediate component 107 may be able to even omit sending message 155 at all.

Accordingly, FIGS. 1A-1D illustrates a number of different components and schematics for seamlessly integrating the functionality of an object-oriented design application with a record-based design application. In addition to the foregoing, implementations of the present invention can also be used to automatically import and render CAD-based object entities corresponding to design elements from geometry-based programs virtually instantly, and in the exact manner that the user drew and configured the design elements. This means that the three-dimensional interface can precisely capture finish features (and even layouts of colors, grain patterns, dimensions, etc.) that the user previously selected in a third party program, and thus allow the user to use intermediate interface 107 primarily to view, rotate, and travel around (e.g., "fly through" navigation) the user's designs. In at least one implementation, this ability to render the design elements in an instantaneous fashion can be provided to the user with or without accompanying conversion to, or creation of, intelligent objects in database 117.

Figure 2:
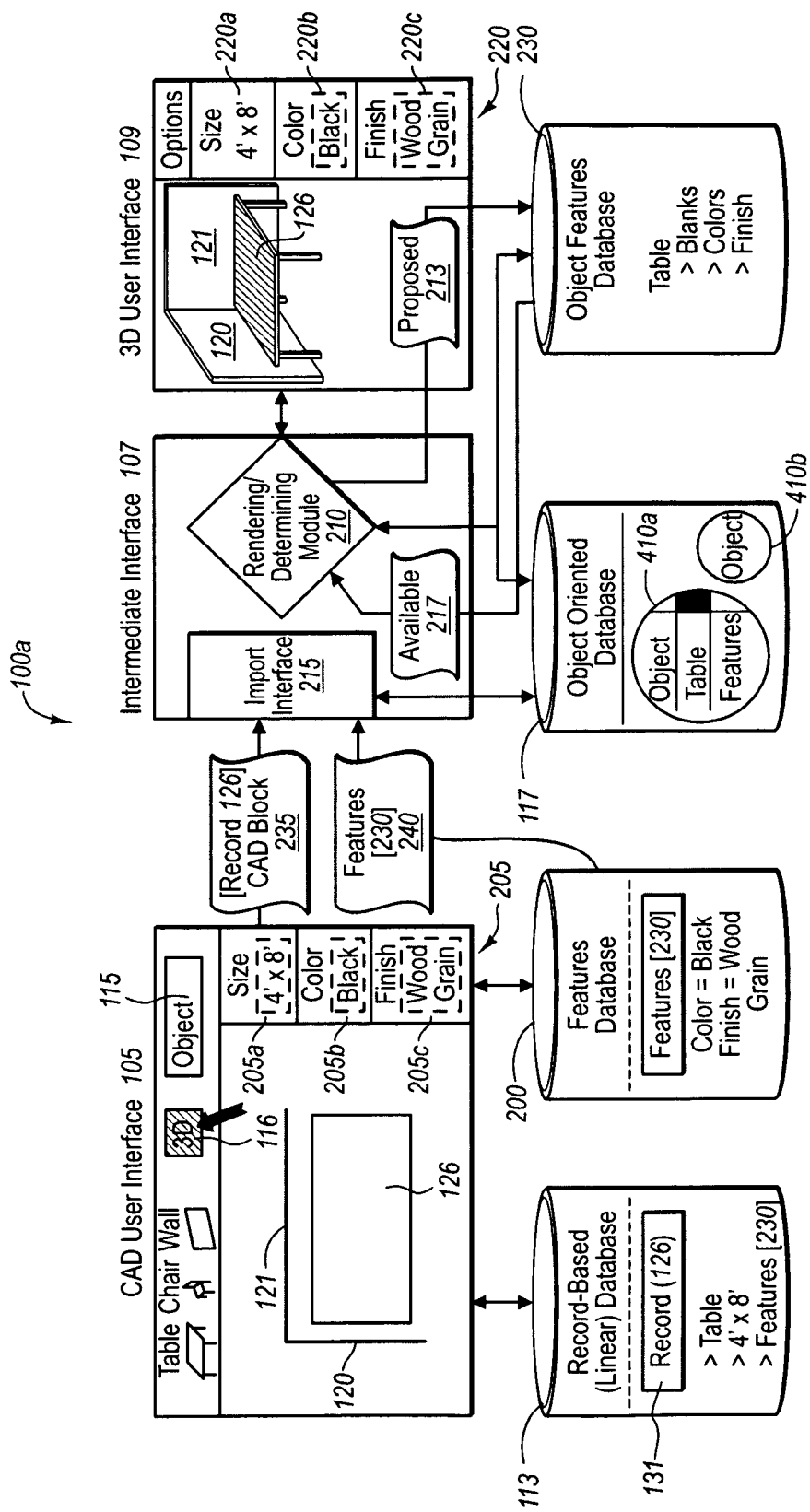
FIG. 2 illustrates a schematic in which the previously illustrated intermediate interface renders one or more CAD design elements from a CAD user interface in a three-dimensional interface without necessarily creating corresponding intelligent objects.

For example, FIG. 2 illustrates an overview schematic diagram of system 100a, which is an additional or alternate implementation of previously described system 100. As understood more fully herein, system 100a can provide still other advantages for those who may want to use the software corresponding to intermediate interface 107 primarily for rendering, rather than rendering and correlation with real-world values (e.g., via intelligent objects). In particular, FIG. 2 illustrates system 100a, in which a user uses CAD user interface 105 and intermediate interface 107 to create a three-dimensional view of a design element in the form of a CAD block/line in the manner drawn by the user, but without necessarily creating any corresponding intelligent object entities (e.g., 133, 137, etc.) for the record (e.g., 120, 125, etc.)

There may be a number of reasons why a user may want to create renderings without initially creating intelligent object entities (or "objects"). For example, the user may desire to simply render CAD drawings in 3D in a quick, efficient manner, and not worry that some of the color or physical arrangements of elements may not be possible. That is, and as previously mentioned, the intelligent objects (e.g., 133, 137) are generally configured to automatically move or update a drawing in accordance with actual, real-world variables (e.g., tables cannot be placed on top of walls, chairs that come only in black or white cannot be colored in blue, etc.). Thus, without creating objects, the present software can ensure that it renders the user's designs in the three-dimensional interface (as in FIG. 2) with precision. Furthermore, as understood more fully herein, without creating intelligent objects, the user can modify the 3-D rendering of the user's design without, in some cases, automatically updating the corresponding CAD entities.

Along these lines, FIG. 2 shows that CAD interface 105 comprises (or comprises a reference to) one or more features toolbars 205, which can further comprise various, selectable feature elements 205a, 205b and 205c. For example, CAD user interface 105 may provide its own features toolbar 205. In other cases, a third-party application program (not shown) provides toolbar 205, and/or manages input with respect to the corresponding options 205a-c, etc. In either case, the illustrated example shows that these selectable feature elements 205a, 205b, and 205c allow a user to modify a design element for size, color and finish in the CAD user interface 105. In particular, FIG. 2 shows that the table corresponding to design element 126 is four feet by eight feet, black, and having a wood grain finish. As the user selects and modifies these selectable feature options 205a-c, FIG. 2 shows that the corresponding CAD program populates the user's selections in various records.

In one implementation, the CAD program (which provides CAD interface 105) maintains these records in separate files and/or in separate databases. Nevertheless, one will appreciate that this is not required, and the CAD program can maintain such information in a single database with single records not only for design choices but for design element features. In any event, FIG. 2 illustrates an implementation in which the CAD program uses the record-based database 113, and/or a separate database features database 200. Furthermore, FIG. 2 shows that the CAD program stores the user's selections for the table and for the table features in separate records (i.e., 131, and 203). Thus, in order to accurately render the selected table design element 126 as drawn by the user, the intermediate interface 107 will ultimately need to receive all of the information drawn by the user, which, in this case means receipt of multiple files including both any CAD-based design entities (CAD blocks or lines) and corresponding features.

For example, FIG. 2 shows that the user has selected 3D option 116. In the illustrated implementation, this user selection causes intermediate interface 107 to begin upload and rendering process. Along these lines, FIG. 2 shows that intermediate interface 107 receives or imports message 235 from interface 105, which comprises one or more design entities including CAD blocks for the drawn design elements 120 (wall), 121 (wall), and 126 (table) through one or more import interfaces 215. One will appreciate, however, that message 235 could also or alternatively include one or more CAD design entities in the form of CAD lines, in addition to or in lieu of CAD blocks, as such.

Although, in some implementations, rendering/determining module 210 could draw the CAD design elements in 3D in interface 109 on this information alone, such drawings would not comprise the context of finishes that the user selected in CAD interface 105, and thus would be inexact. In at least one implementation, for example, the CAD design elements represent components of specific dimensions with specific attributes, and both dimensions and applicable attributes must be recognized and correctly applied by the present invention, in order to represent the components properly in the rendering. Thus, FIG. 2 shows that the intermediate interface 107 further receives one or more additional messages 240 comprising information regarding the selected features 203 that the user made in CAD interface 105 (via toolbar 205).

In at least one implementation, the features 203 in message 240 can comprise a Standard Information File (or SIF), although any number of file formats may be used to transmit design element feature information. FIG. 2 also shows that intermediate interface 107 receives message 240 regarding user-selected features from features database 200 (or a third-party application managing the features toolbar 205 and/or features database 200). Of course, one will appreciate that intermediate interface 107 could receive the features message 240 from the CAD program itself in some implementations.

In any event, and upon receipt of messages/communications 235, 240, FIG. 2 shows that import interface 215 passes the received information for processing through one or more processing components or modules, such as rendering/determining module 210. In contrast with the discussion herein with respect to FIGS. 1A-1D, intermediate interface 107 does not automatically correlate and create any intelligent objects (or intelligent object entities) in this case, per se, since the user has not selected the object option 115. As previously mentioned, the user has not selected object option 115 in this case. As such, FIG. 2 shows that object-oriented database 117 comprises "unintelligent" or "dumb" objects 410a, 410b, etc., upon the import and processing of CAD design entities.

By way of explanation, these unintelligent (or dumb) objects 410a, 410b, etc. merely maintain information in object-oriented database 117 with regard to the CAD design elements and corresponding features that import interface 215 received in messages 235, 240. In contrast with the intelligent objects otherwise described herein (e.g., FIGS. 1A-1D, and FIG. 4), FIG. 2, however, these unintelligent objects 410a, 410b are not linked to each other, and are not linked to any other objects or reference libraries (e.g., 420, FIG. 4). As a result, although the unintelligent objects 410a, 410b, etc. may have some limited auto-resolving functionality (e.g., they may be able to "snap" into an appropriate position in user interface 109), they cannot continually resolve themselves in lieu of changes to other objects in database 117, or to any other changes in a reference library or features database 230.

Referring again to FIG. 4, as the information in communications 235 and 240 does not comprise rendering instructions, but rather comprises information identifying design elements and selected features, rendering module 210 does not actually attempt to render (directly) what is received. Rather, part of rendering communications 235 and 240 in an "instant" involves gathering and processing pre-rendered information (i.e., "previously-generated rendering information") in various forms to recreate the user's selections in 3D. For example, FIG. 2 illustrates that intermediate interface 107 can further comprise reference to one or more object features database 230. In at least one implementation, object features database 230 comprises pre-rendered design instructions, which instructions the database 230 obtained in a separate step by rendering various design elements, shadows, and finishes for 3D representation.

Thus, rather than render each particular CAD design entity (CAD block and/or CAD line) as the interface 107 receives it from the corresponding CAD program, rendering/determining module 210 can merely combine pre-rendered instructions as a set of new rendering instructions for display. For example, upon receipt of communications 235, 240 from the CAD program, rendering/determination module 210 queries object features database 230 (e.g., via one or more messages 213) to determine the existence of the user's requested CAD design elements, as well as the user-selected features for the CAD design elements. In some cases, this can involve coordinating CAD-entity information with standard stock-keeping unit (SKU) information maintained by either or both of the CAD program and the object-oriented program corresponding to intermediate interface 107. Either way, FIG. 2 shows that rendering/determining module 210 queries database 230 to identify if there are prior 3D renderings of a table, table shading, black color, and wood grain finishes, etc., as necessary to draw the design.

Rendering module 210 can then receive one or more answers (e.g., messages 217) that either include the requested rendering instructions, or indicate that the instructions do not exist. Notably, in this case, object-features database 230 will not determine whether specific design elements should (or can) include specific features, such as in inventory. Thus, even if a particular table does not allow for a wood grain finish, at least one implementation of the invention allows object features database 230 (and/or object-oriented database 117, if applicable) to still provide rendering instructions for the particular table and wood grain finish since the users selected it.

In addition, if the rendering/determining module 210 does not identify rendering instructions for a particular CAD design entity/element or feature, there are a number of ways intermediate interface 107 can proceed. For example, rendering determining module 210 can render the CAD design element without the unavailable feature, or otherwise render the design element with a closely matching feature. Similarly, if the design element (e.g., table, chair, etc.) does not exist at all in the intermediate interface 107 inventor, rendering/determining module 109 could draw the remaining design elements in interface 109, but place either an error message or the like in place of the requested design element.

In any event, FIG. 2 shows that, in this example, the requested features (e.g., via message 240) do correlate with what is available in the object features database. As a result, FIG. 2 shows rendering/determining module 210 is able to render the requested walls and tables in 3D user interface 109 precisely as the user requested them in the CAD interface 105. Specifically, 3D user interface 109 shows a three-dimensional version of the table 126 with the exact size (i.e., 4×8 feet), color (i.e., black) and finishes (i.e., wood grain) selected by the user in the CAD user interface 105. Furthermore, user-interface 109 is able to display these design elements virtually at the same instant that the user selected 3D option 116 in CAD interface 105. As such, implementations of the present invention provide a much richer, and more realistic view of design elements created in CAD interfaces, particularly for simply viewing what the user has created, and compared with conventional rendering software.

As previously mentioned, intermediate interface 107 only created unintelligent objects 410*a*, 410*b*, and thus did not create any automatically and continually resolvable intelligent objects (e.g., 410*a*', 410*b*', etc.) for the imported CAD design element(s) and corresponding features (e.g., messages 235, 240). Nevertheless, intermediate interface 107 can still provide the user the ability to still move, navigate around, or otherwise modify the user's design in 3D user-interface 109 at least in part. In at least one implementation, for example, intermediate interface 107 provides the user, through 3D user interface 109, the ability to change feature information on the design elements such as color, finish, or other style choices. In this implementation, the intermediate interface 107 might also be configured to disallow changes to such things as dimension, or additions/deletions of design elements into the drawing.

Along these lines, FIGS. 3A, 3B and 3C illustrate examples of the aforementioned functionality. For example, FIG. 3A shows that the user can rotate the view of design elements in user interface 109 to see a perspective top view thereof. In addition, FIG. 3B shows that the user can navigate underneath (and fly through) the table, and further view other design elements from that perspective. In addition, FIG. 3C shows that the user can also manipulate aspects of the design elements to some extent. For example, FIG. 3C shows that the user has changed not only the color, but also the finish of the table design element 126 so that the color is spotted, the material finish is glass, and such that interface 109 shows the new, three-dimensional view of table 126*a*.

As previously mentioned, however, this particular implementation of displaying the user's design choices are simply for viewing purposes in the three dimensional view, and such changes are thus not replicated either to object-oriented database 117 or back to CAD interface 105. For example, the features toolbar 220 that user-interface 109 provides to the user in FIG. 3C facilitates changing of color and finish, but not of dimension or type of design element (e.g., table or chair) in this example. That is, the intermediate interface 107 provides some of the user's selected features as modifiable options, but provides other user-selected features as being non-modifiable.

In some additional implementations, the 3D user interface 109 could still allow a user to add or replace different design elements, even those of different dimensions, even though only unintelligent objects 410*a*, 410*b* are being used. In such cases the user would have to move or rotate the design elements in the user interface 109 himself in order to accommodate any changes (e.g., dimensional changes), as the objects 410*a*, 410*b* would not automatically resolve and make such changes for the user (in contrast with objects 410*a*' and 410*b*' discussed below). Thus, in these types of implementations using unintelligent objects, therefore, the intermediate interface 107 provides a relatively limited, but at the same time rich, viewing experience of the user's CAD designs.

Figure 4:
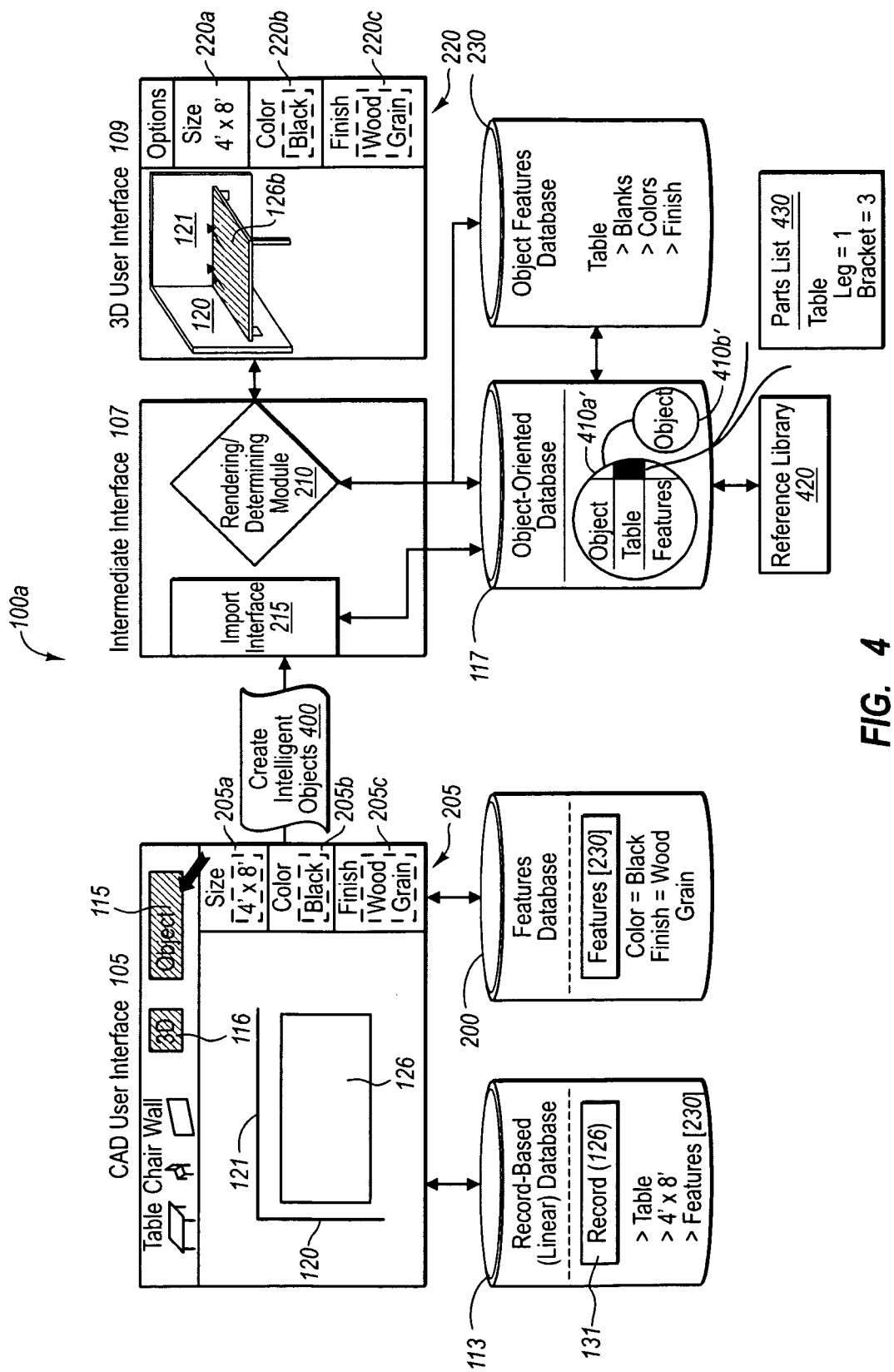
FIG. 4 illustrates a schematic of the implementations shown in FIGS. 2 through 3C in which the user subsequently generates intelligent objects corresponding to the rendered design elements, and further performs one or more modifications thereto.

By contrast, and for the user to be able to change all the features of the table, specifically the dimensions of the table, as well as modify, delete, or add design elements in the 3D user interface 109 in automatically resolvable ways, the user will need to create an intelligent object for each the design elements. For example, FIG. 4 illustrates an implementation in which the user has selected (in CAD user interface 105) not only the 3D option 116, but also the object option 115. As previously described, this signals intermediate interface 107 to create one or more intelligent objects for the received CAD design elements and features. In one implementation, this can occur by CAD user interface 105 sending one or more messages 400 to the intermediate interface 107 that tells the intermediate interface 107 to create one or more intelligent objects.

Along these lines, FIG. 4 shows that rendering/determining module 210 of intermediate interface 107 then generates one or more corresponding intelligent objects 410*a*' and 410*b*' in object-oriented database 117. In at least one implementation, this generation of intelligent objects involves "adding intelligence" to (or otherwise converting) the existing "unintelligent" objects 410*a*, 410*b*, etc. In one implementation, for example, intermediate interface 107 adds intelligence at least in part by creating one or more links between related existing objects so that changes in one object can be automatically resolved and/or reflected in another linked object.

In addition, intermediate interface 107 can also add one or more links between these linked objects and one or more reference libraries 420 and/or to the object features database 230. In this case, the links can ensure that changes in the reference library 420 and/or object features database 230 are automatically resolved or replicated in the intelligent objects 410*a*', 410*b*', and vice-versa. In still further implementations, intermediate interface 107 can add additional computer-executable routines that cause each intelligent object 410' to not only identify changes in other objects or libraries, but also to react to such changes in an automatic, continual way.

Figure 3:
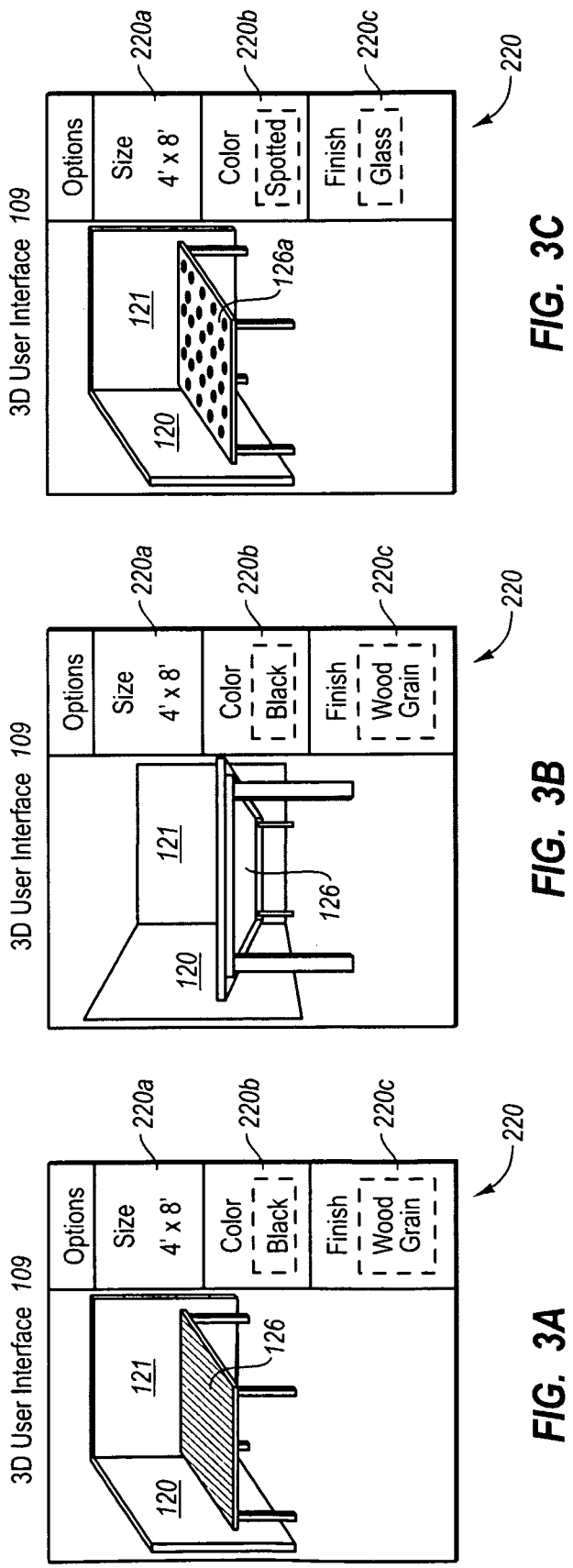
FIG. 3A illustrates a three-dimensional user interface, such as shown in FIG. 2, in which the user rotates rendered design elements corresponding to imported CAD design elements for a top, perspective view thereof.
FIG. 3B illustrates the three-dimensional user interface of FIG. 3A in which the user rotates the rendered design elements for a bottom, perspective view thereof as part of a "fly-through" navigation experience.
FIG. 3C illustrates the user interface of FIGS. 3A and 3B in which the user further manipulates various features of the rendered design elements.

However generated or created, FIG. 4 shows that object-oriented database 117 now comprises at least an intelligent object 410*a*' for a table, and further comprises references to the previously selected features. In addition, object-oriented software (i.e., intermediate interface 107) can save groupings of components/design elements as typical groupings within the object-oriented database 117 for future use. For example, in addition to what is shown in FIGS. 2-4, the user can also select one or more options to group elements 120, 121, and 126. The user can then use the software (i.e., the intermediate interface 107) to convert existing typical arrangements to intelligent object-oriented arrangements (in database 117) quickly and easily. When the user places such the saved arrangement in any future design, the user can also rearrange or manipulate that typical arrangement and the components thereof at any time.

Referring again to FIG. 4, now that the user has created one or more intelligent objects (e.g., 410*a*', 410*b*' or generally as 410') for this particular table (and/or other design elements) (and/or objects for the group of design elements), the user can now manipulate the design elements in the user interface 109. For example, the user can move the table into a variety of different locations in the design space, or otherwise manipulate the table and any other design elements in the 3D user interface 109 in a coordinated, real-world way. This means that the given intelligent object 410' will continually reflect the user's design choices as it automatically resolves itself with each user input, but constrain those choices based on what is physically possible (i.e., not putting a table on top of a wall), or what is available in inventory (i.e., limiting color and finish selections to certain types of tables in stock, etc.) Furthermore, the intelligent object 410' can continually maintain and update one or more parts lists for the user's design as appropriate for the 3D layout in interface 109.

For example, FIG. 4 illustrates an implementation in which the user moves the object-oriented design element 126b in the three-dimensional interface 109 so that the table 126b directly abuts the two walls 120 and 121. In this case, the user has also selected a particular table that optimally uses connector brackets instead of table legs when placed in a certain way. As such, when the user positions table 126 against walls 120 and 121, the intelligent object 410a' correlates the new positioning information with other object information (e.g., 410b' for a wall).

In at least one implementation, intelligent object 410a' further correlates the new positioning information with data from a reference library, which stores rules and options for each type of design element. Accordingly, due to the various relationships the intelligent object 410a' has with other objects for the design elements in user-interface 109, and based on the information in reference library 420, intelligent object 410a' automatically updates the table to remove three table legs and add brackets. In particular, FIG. 4 shows that user interface 109 provides a 3D view of table 126b with only one table leg and various brackets against walls 120 and 121.

In addition to the foregoing, using intelligent objects 410' (also 133, 137, FIGS. 1A-1D) in this case allows a number of additional advantages not otherwise found when simply rendering the CAD design entities such as shown in FIGS. 2, and 3A-3C. For example, as previously mentioned in FIGS. 1A-1D and the corresponding discussion, intermediate interface 107 can continually and automatically send back corrections or changes in the CAD design entities to the CAD program corresponding to CAD user interface 105. In addition, and as previously mentioned, the ability to continually update various parts and finishes based on each user selection for positioning and addition/deletion of design elements allows the intermediate interface 107 to continually maintain an accurate parts list.

For example, at the moment the user positions table 126 against walls 120 and 121, the automatic determinations by intelligent object 410a' can also be instantly reflected in an updated parts list. Along these lines, FIG. 4 illustrates an updated parts list 430, which indicates, based on intelligent object 410a' (for table 126), that the table has 1 leg and 3 support brackets. Thus, one will appreciate that at virtually any point in time while the user is viewing or modifying the design elements in 3D user interface 109, and the user is satisfied with the drawing in user interface 109, the user can generate an accurate parts list. For example, the user can ask intermediate interface 107 to open a user interface with a modifiable parts list, which the user can continually change or update, which changes can be instantly reflect in the drawings in 3D user interface 109.

As such, a user could alternatively make edits in the parts list (or a Bill of Materials, Order Proposal, reports etc.) and have this instantly reflected in the 3D user interface 109. Upon selecting the 3D user interface 109, any changes that the user made in the parts list would thus be automatically reflected in the rendering of the 3D user interface. For example, if the color blue were available for the table 126, and the user edited the color from black to blue in the parts list, the user interface 109 would automatically be updated to show the table in the color blue, where appropriate. The user can then send any such parts lists (or Bill of Materials, Order Proposals, etc.) on to manufacturing, as appropriate.

In still other cases, the user can generate one or more output files (not shown) that are accurate, and can be used to update the features database 200, corresponding third-party application(s) managing the database, and/or the CAD program managing CAD user interface 105. As with generating a parts list, for example, the user can similarly ask intermediate interface 107 to generate one or more output files based on the current drawing in interface 109 that the user can pass to another entity. The intermediate interface 107 (e.g., via interface 215) can then pass the output file directly to features database 200, and/or to the third-party application program that manages features database 200. Then, when using CAD user interface 105 again, the CAD design elements (e.g., including any CAD blocks of CAD lines)

Accordingly, FIGS. 2-4 and the corresponding text illustrate or describe a number of components, modules, and mechanisms that can be used to enhance efficiency in the computer-aided drawing/design workspace with options to create software objects, or otherwise draw rich designs without creating software objects. In addition to the foregoing, implementations of the present invention can also be described in terms of one or more acts in a method for accomplishing a particular result. For example, FIGS. 5 and 6 illustrate flowchart of alternate computer-implemented methods of using an object-oriented design program to instantly render user designs created in a CAD program. The acts of these flowcharts are described below with respect to the components and diagrams of FIGS. 1A-4.

For example, FIG. 5 shows that a method of using an object-oriented design program to instantly render user designs made in a computer-aided design (CAD) program comprises an act 500 of identifying a user request to render a CAD drawing in 3D. Act 500 can include identifying one or more user requests to render in a three-dimensional user interface one or more design elements created in a separate CAD user interface. For example, FIG. 2 shows that the user has selected 3D option 115 in the CAD user interface 105. In one implementation, this sends a separate message to intermediate interface 107 indicating that the user is ready to render what is drawn in the CAD user interface 105. One will appreciate, however, that this request to render the CAD drawings can also be sent with the CAD design elements as described below.

Along these lines, FIG. 5 also shows that the method of instantly rendering these CAD drawings comprises an act 510 of receiving one or more CAD design elements for each requested drawing. Act 510 can include receiving one or more CAD design elements that represent one or more CAD block or line design elements created by the user in the CAD user interface. For example, FIG. 2 shows that intermediate interface 107, such as via import interface 215, receives one or more CAD design elements (e.g., via corresponding record 131). In one implementation, message 235 further comprises the one or more requests in message 235 to render the CAD design elements in 3D.

In addition, FIG. 5 shows that the method can comprise an act 520 of receiving one or more files with feature information. Act 520 can include receiving one or more files that identify features of the design elements that the user selected in the CAD user interface. For example, FIG. 2 shows that intermediate interface 107, such as via import interface 215, further receives message 240 comprising feature information. In at least one implementation, and as previously described, this feature information can comprise information such as color or style choices, material choices, finish choices, and so on, which are used to define the look and feel of the CAD design elements made by the user in CAD user interface 105.

Furthermore, FIG. 5 shows that the method can comprise an act 530 of instantly displaying 3D rendering of the CAD design elements with pre-rendered information. Act 530 can includes automatically displaying the CAD design elements as three-dimensional design elements in the three-dimensional user interface using previously-generated rendering instructions. For example, FIG. 2 shows that intermediate interface 107, such as via rendering/determining module 210 processes messages 235 and 240 in conjunction with the previously rendered information stored in object features database 230. Rendering/determining module 210 then uses the previously rendered information to instantly render the received CAD design elements and corresponding features (e.g., via messages 235, 240) in 3D user-interface 109, just as the user drew them in CAD user interface 105.

In addition to the foregoing, FIG. 6 illustrates that an additional or alternative method of the present invention of rendering CAD design elements comprises an act 600 of identifying a user request to render a CAD drawing in 3D without creating any intelligent software objects. Act 600 can include identifying one or more user requests to render in a three-dimensional user interface one or more design elements created in a separate CAD user interface, wherein the one or more user requests further indicate that no intelligent objects are to be created. For example, as previously discussed, when a user selected 3D option 116 but not object option 115, intermediate interface 107 can still import and render CAD design elements, but will do so using the precise drawings and features indicated by the user in the CAD interface. This is enabled at least in part in this example by the intermediate interface 107 also not creating any intelligent software objects, which could change the renderings of the CAD design elements in a way that the user did not intend to draw in the CAD interface 105, or for which the user may not have been forewarned.

FIG. 6 also shows that the method comprises an act 610 of importing CAD design elements for each requested design element. Act 610 can include importing from the CAD program into the object-oriented program one or more CAD design elements that represent one or more CAD block or line design elements created by the user in the CAD user interface. For example, FIG. 2 shows that intermediate interface 107, such as via import interface 215, receives one or more messages 235 comprising CAD design elements corresponding to the user's designs in CAD user interface 105.

In addition, FIG. 6 shows that the method can comprise an act 620 of importing a separate feature file for the imported CAD design elements. Act 620 can include importing a separate feature file comprising user-selected features corresponding to the one or more design elements in the one or CAD design elements. For example, as previously mentioned, FIG. 2 shows that intermediate interface 107 further receives one or more messages 240 comprising feature files that indicate various finish information about the CAD design elements, which features the user selected in the CAD interface 105. In one implementation, intermediate interface 107 can alternatively receive both the feature information and the CAD design elements (CAD blocks and/or CAD lines) in the same import step.

Furthermore, FIG. 6 shows that the method comprises an act 630 of displaying the CAD design elements in 3D with pre-rendered information. Act 630 can include automatically displaying the CAD design elements as three-dimensional design elements in the three-dimensional user interface using previously-generated rendering instructions. For example, and as also previously mentioned, FIG. 2 shows that intermediate interface 107, such as via rendering/determining module 210, can immediately render the received CAD design elements and corresponding features by using pre-rendered (or previously-generated rendering) information stored in object features database 230. Thus, virtually upon receipt of messages 235 and 240, rendering/determining module 210 prepares a fully rendered version of the design elements in user-interface 109.

Still further, FIG. 6 shows that the method comprises an act 640 of displaying some of the received features as modifiable, and other as non-modifiable. Act 640 can include displaying in the three-dimensional user interface at least one of the user-selected features from the feature file as being non-modifiable, and another of the user-selected features from the feature file as being modifiable. For example, as shown in FIG. 2, 3D user-interface 109 shows the feature options in toolbar 220 for color and finish as being modifiable, but does not show the dimensional options for size as being modifiable. As understood with respect to FIG. 4, however, the intermediate interface 107 can provide the user with total access to modify each of the features presented in toolbar 220.

In view of the foregoing, one will appreciate that the components and modules of the present invention can capture product knowledge automatically rather than requiring the user to remember and continually cross-reference and update various applications. This automatic calculation and correction by the software can minimize human error, and further allow for immediate design change capability without rework, reduction or elimination of manual audit process, and automation of drawing and document creation processes. Such error reduction is further enhanced not only by automated corrections, but also due to accurate 3D validation of the design, and further allowing more sales due to the faster time to delivery and powerful visual lure of the 3D representation. For at least these and other reasons contained herein, implementations of the present invention provide a wide range of advantages in both designing, rendering, viewing, and finalizing designs, regardless whether the designs were created using the more conventional records-based drawing/design programs (e.g., CAD programs).

The embodiments of the present invention may comprise a special purpose or general-purpose computer including various computer hardware, as discussed in greater detail below. Embodiments within the scope of the present invention also include computer-readable media for carrying or having computer-executable instructions or data structures stored thereon. Such computer-readable media can be any available media that can be accessed by a general purpose or special purpose computer.

By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. A method of using an object-oriented design program that utilizes an object-oriented database to instantly render user designs made in a Computer-Aided Design ("CAD") program that utilizes a record-based linear database, comprising the acts of:
   identifying one or more user requests through a user interface on a computer display to render one or more design elements created in the CAD program using the object-oriented design program, and importing one or more CAD records from the record-based linear database that represent the one or more design elements created in the CAD program;
   automatically creating one or more unintelligent objects in the objected-oriented database using the one or more records, the one or more unintelligent objects comprising automatically independently executable software instructions apart from the CAD program with limited functionality, wherein the unintelligent objects are unlinked to one or more intelligent objects, and do not automatically resolve with changes to any other created object;
   upon identifying a change in status to an object-oriented environment, creating one or more intelligent objects in response to one or more additional user design elements received through the user interface, wherein the one or more intelligent objects comprise independently executable software instructions apart from the CAD program with expanded functionality, wherein the intelligent objects are linked to one or more other intelligent objects, and automatically resolve with changes to any other linked intelligent object;
   displaying a representation of a three-dimensional view of the one or more design elements corresponding to unintelligent objects and corresponding to one or more additional design elements corresponding to intelligent objects;
   receiving one or more requests to create one or more new object-oriented intelligent objects corresponding to the one or more design elements; and
   generating the one or more new object-oriented intelligent objects, wherein the one or more new object-oriented intelligent objects comprise automatically resolving software instructions that correlate with the one or more reference libraries and with one or more other object-oriented objects.

2. The method as recited in claim 1, further comprising the acts of:
   receiving one or more user instructions to manipulate at least one design element in the user interface of the object-oriented design program; and
   displaying the user-directed change to the at least one design element using other previously-generated rendering instructions.

3. The method as recited in claim 2, wherein the user-directed change comprises a change in color or finish selection for the at least one design element.

4. The method as recited in claim 2, wherein the user-directed change comprises a change in material for the at least one design element.

5. The method as recited in claim 2, wherein the object-oriented design program further comprises one or more reference libraries that indicates available features for particular design elements.

6. The method as recited in claim 5, wherein:
   the user-directed change comprises a change in material for the at least one design element; and
   the one or more reference libraries comprise one or more values that indicate that the user-directed feature change does not correlate with what is available for the at least one design element.

7. The method as recited in claim 6, further comprising an act of rendering the user-directed change in material along with the rendering of the at least one design element in spite of the non-correlation per the one or more reference libraries.

8. The method as recited in claim 7, wherein the act of generating the one or more new object-oriented intelligent objects further comprises converting one or more new object-oriented unintelligent objects corresponding to the one or more design elements by linking the new object-oriented unintelligent objects to one or more other objects.

9. The method as recited in claim 7, further comprising:
   the newly generated one or more new object-oriented objects automatically communicating with the one or more reference libraries; and
   the newly generated one or more new object-oriented objects identifying that the user-directed change in features is unavailable for the at least one design element.

10. The method as recited in claim 9, further comprising automatically correcting the view of the at least one design element in the user interface of the object-oriented design program so that the user-directed feature change is no longer displayed.

11. The method as recited in claim 10, further comprising sending one or more updates to the CAD program that change one or more records corresponding to the at least one design element, wherein the one or more updates correspond to the automatic correction.

12. A method of using an object-oriented design program that utilizes an object-oriented database to instantly render user designs made in a computer-aided design ("CAD") program that utilizes a record-based linear database, comprising the acts of:
   identifying one or more user requests to render a three-dimensional representation of one or more design elements created in the CAD program;
   importing from the record-based linear database of the CAD program into the object-oriented program one or more records that represent one or more design elements created by the user in the CAD program;
   automatically creating a plurality of objects in the objected-oriented database based on the one or more records and one or more additional design elements created by the user;
   wherein:
     the plurality of objects comprise automatically resolving software instructions that are independently executable apart from the CAD program, and include:
       i) one or more unintelligent software objects and ii) one or more intelligent software objects;

the one or more unintelligent software objects correspond to the imported one or more design elements, and are unlinked to another software object in the object-oriented database; and the one or more intelligent objects correspond to the additional design elements, and are linked to another software object in the object-oriented database;

automatically displaying a representation of a three-dimensional view each imported and created design elements, including design elements corresponding to unintelligent objects and intelligent objects using previously-generated rendering instructions; and for at least one design element corresponding to an unintelligent object, displaying in the user interface of the object-oriented design program at least one feature of the user-selected features from the feature file as being non-modifiable, and another feature of the user-selected features from the feature file as being modifiable.

13. The method as recited in claim 12, wherein:
the at least one feature displayed as being non-modifiable comprises dimension information; and
the another feature displayed as being modifiable comprises information related to color, finish, or material of the one or more design elements.

14. The method as recited in claim 12, further comprising:
receiving one or more user requests to generate one or more object-oriented intelligent objects corresponding to the received one or more design elements represented in the user interface of the object-oriented design program; and
displaying all of the user-selected features as being modifiable for each intelligent object even though design elements corresponding to unintelligent objects are also displayed, and include non-modifiable features.

15. The method as recited in claim 14, further comprising:
identifying that at least one record corresponding to the one or more imported design elements has been converted to an intelligent object and has been updated in the CAD program;
automatically determining through the intelligent object that the update in the CAD program is possible; and
automatically using additional rendering information that was previously generated to render the updates in the user interface of the object-oriented design program.

16. The method as recited in claim 14, wherein:
the one or more user requests comprise a request to create an intelligent object corresponding to one or more groupings of design elements represented in the user interface of the object-oriented design program; and
the one or more groupings are designated as a typical grouping.

17. The method as recited in claim 16, further comprising:
saving one or more intelligent objects corresponding to the typical grouping; and
providing one or more selectable options in a subsequent view of user interface of the object-oriented design program that provide access to the typical grouping.

18. The method as recited in claim 17, further comprising:
receiving one or more subsequent requests through the user interface of the object-oriented design program for the typical grouping; and
accessing one or more records and one or more features corresponding to the typical grouping from the saved one or more intelligent objects corresponding to the typical grouping.

19. A computer-program hardware storage device that is not a carrier wave or signal, having computer-executable instructions stored thereon that, when executed, cause one or more processors to perform a method of using an object-oriented design program that utilizes an object-oriented database to instantly render user designs made in a Computer-Aided Design ("CAD") program that utilizes a record-based linear database, the method comprising:
identifying one or more user requests to render one or more design elements created in the CAD program using the object-oriented design program, and importing one or more records from the record-based linear database that represent the one or more design elements created in the CAD program;
automatically creating one or more unintelligent objects in the objected-oriented database using the one or more records, the one or more unintelligent objects comprising automatically independently executable software instructions apart from the CAD program with limited functionality, wherein the unintelligent objects are unlinked to one or more intelligent objects, and do not automatically resolve with changes to any other created object;
upon identifying a change in status to an object-oriented environment, creating one or more intelligent objects in response to one or more additional user design elements received through the user interface, wherein the one or more intelligent objects comprise independently executable software instructions apart from the CAD program with expanded functionality, wherein the intelligent objects are linked to one or more other intelligent objects, and automatically resolve with changes to any other linked intelligent object;
automatically displaying a representation of a three-dimensional view of the one or more design elements corresponding to unintelligent objects and corresponding to one or more additional design elements corresponding to intelligent objects;
receiving one or more requests to create one or more new object-oriented intelligent objects corresponding to the one or more design elements; and
generating the one or more new object-oriented intelligent objects, wherein the one or more new object-oriented intelligent objects comprise automatically resolving software instructions that correlate with the one or more reference libraries and with one or more other object-oriented objects.

20. The method as recited in claim 1, further comprising the acts of:
identifying that a status for one or more new design elements is set to a non-object oriented status, such that the user interface displays at least one design element that is not associated with an object, and a plurality of design elements that are associated with an intelligent and/or unintelligent object;
receiving a request to switch to an object-oriented design view; and
displaying only those design elements associated with an intelligent and/or unintelligent object, but not the one or more new design elements that were drawn in the non-object oriented status.

* * * * *

UNITED STATES PATENT AND TRADEMARK OFFICE
CERTIFICATE OF CORRECTION

PATENT NO. : 8,762,941 B2
APPLICATION NO. : 12/444893
DATED : June 24, 2014
INVENTOR(S) : Loberg et al.

Page 1 of 1

It is certified that error appears in the above-identified patent and that said Letters Patent is hereby corrected as shown below:

In the Specification

Column 2
Line 21, change "The often means" to --This often means--

Column 3
Line 63, change "one or CAD blocks" to --one or more CAD blocks--

Column 5
Line 64, change "objected-oriented-based" to --object-oriented-based--

Column 6
Line 13, change "interface 107 components 107, which are" to --interface 107 components, which are--

Column 13
Line 67, change "each the design" to --each of the design--

Signed and Sealed this
Twelfth Day of May, 2015

Michelle K. Lee
*Director of the United States Patent and Trademark Office*